(12) United States Patent
Salomon et al.

(10) Patent No.: US 7,797,142 B2
(45) Date of Patent: Sep. 14, 2010

(54) SIMULATING CAVITATION DAMAGE

(75) Inventors: John B. Salomon, Metamora, IL (US); Andrew N. McGilvray, East Peoria, IL (US); Joseph P. Maruszewski, Skokie, IL (US)

(73) Assignee: Caterpillar Inc, Peoria, IL (US)

( * ) Notice: Subject to any disclaimer, the term of this patent is extended or adjusted under 35 U.S.C. 154(b) by 769 days.

(21) Appl. No.: 11/642,745

(22) Filed: Dec. 21, 2006

(65) Prior Publication Data
US 2008/0154557 A1 Jun. 26, 2008

(51) Int. Cl.
G06F 9/455 (2006.01)
(52) U.S. Cl. .................... 703/9; 137/565.19; 73/168
(58) Field of Classification Search .............. 703/9; 137/583, 625.3; 73/86, 168; 366/108; 422/20; 123/447; 451/5; 138/37; 347/74; 623/3.13; 424/94.64; 417/410.4
See application file for complete search history.

(56) References Cited

U.S. PATENT DOCUMENTS

| | | | | |
|---|---|---|---|---|
| 3,866,630 | A * | 2/1975 | Webb et al. ................ | 137/583 |
| 4,058,004 | A * | 11/1977 | Hammitt et al. ............. | 73/86 |
| 4,569,370 | A * | 2/1986 | Witt .......................... | 137/625.3 |
| 4,965,743 | A | 10/1990 | Malin et al. | |
| 5,332,356 | A | 7/1994 | Gülich | |
| 5,537,641 | A | 7/1996 | da Viroria Lobo et al. | |
| 5,801,969 | A | 9/1998 | Nagahama | |
| 5,810,052 | A * | 9/1998 | Kozyuk ....................... | 138/37 |
| 5,983,863 | A * | 11/1999 | Cavanagh et al. ........... | 123/447 |
| 6,733,727 | B1 * | 5/2004 | Kullberg ...................... | 422/20 |
| 2002/0009015 | A1 * | 1/2002 | Laugharn et al. ........... | 366/108 |
| 2004/0112115 | A1 | 6/2004 | Ramamoorthy et al. | |
| 2004/0167757 | A1 | 8/2004 | Struijs | |
| 2005/0003737 | A1 * | 1/2005 | Montierth et al. ........... | 451/5 |
| 2005/0169779 | A1 * | 8/2005 | Bratu ......................... | 417/410.4 |
| 2005/0243144 | A1 * | 11/2005 | Dean et al. .................. | 347/74 |
| 2006/0162439 | A1 * | 7/2006 | Du .............................. | 73/168 |
| 2006/0253194 | A1 * | 11/2006 | Dial ............................ | 623/3.13 |
| 2007/0041961 | A1 * | 2/2007 | Hwang et al. ............... | 424/94.64 |

OTHER PUBLICATIONS

"Development of a method for prediction of cavitation erosion in hydraulic machines", A dissertation for Doctor of Sciences degree in the University of Ljubljana, 2005.*

Franc et al., "Cavitation erosion research in France: the state of the art", Journal of Marine science and technology, Sep. 1997.*

Krueger, S.R, "Simulation of cylinder implosion initiated by an underwater explosion", Thesis submitted to Naval Post Graduate School, Jun. 2006.*

(Continued)

*Primary Examiner*—Paul L Rodriguez
*Assistant Examiner*—Kandasamy Thangavelu
(74) *Attorney, Agent, or Firm*—Miller, Mathias & Hull

(57) ABSTRACT

Methods and systems provide a simulation of cavitation damage. In one implementation, a computer-implemented method simulates a potential for cavitation damage. According to the method, data defining a modeled component is imported to a flow solver tool. The flow solver tool simulates a liquid that flows through the modeled component. Voids created by the flow of the liquid cause a plurality of vapor implosion pressure events. The method further includes displaying a histogram showing a portion of the modeled component. On the histogram, locations of the plurality of vapor implosion pressure events are visually distinguishable on a surface of the portion of the modeled component.

20 Claims, 5 Drawing Sheets

OTHER PUBLICATIONS

Hammitt, F.G., "Cavitation erosion state of art and predicting capability", University of Michigan, Apr. 1979.*

Fortes-Patella et al., "Cavitation erosion mechanism: Numerical simulation of the interaction between pressure waves and solid boundaries", CAV 2001.*

Dular et al., Development of a cavitation erosion model, ScienceDirect, Feb. 2006.*

Uchiyama T: "Numerical simulation of caviating flow using the upstream finite element method", Applied Mathematical Modeling Elsevier USA, vol. 22, No. 4-5, Apr. 1998, pp. 235-250, XP002496138, ISSN: 0307-904X.

Mahesh M. Athavale, H.Y. Yu Jing, Ashok K. Singhal: "Application of the Full Cavitation Model to Pumps and Inducers" International Journal of Rotating Machinery, [Online] vol. 8, No. 1, 2002, pp. 45-56, XP002496139, Retrieved from the Internet: URL: http://www.hindawi.com/GetArticle.aspx?doi=10.1155/S1023621X02000052> [retrieved on Sep. 16, 2008].

A. Thiruvengadam, "The Concept of Erosion Strength," *Erosion by Cavitation or Impingement*, ASTM STP 408, American Society For Testing and Materials, 1967, pp. 22-41.

P. A. Lush, "Impact of a Liquid Mass on a Perfectly Plastic Solid," J. Fluid Mech. (1983), vol. 135, pp. 373-387.

W. Yuan, G. Schnerr, "Numerical Simulation of Two-Phase Flow in Injection Nozzles: Interaction of Cavitation and External Jet Formation," J. Fluids Eng., vol. 125, pp. 963-969, 2003.

M. Dular, R. Bachert, B. Stoffel, B. Sirok, "Numerical and Experimental Study of Cavitating Flow on 2D and 3D Hydrofoils," Fifth International Symposium on Cavitation, Osaka, Japan, Nov. 1-4, 2003.

* cited by examiner

SIMULATING CAVITATION DAMAGE

TECHNICAL FIELD

The present disclosure relates generally to simulating cavitation damage, and more particularly, to a system and computer-implemented method that simulates a potential for cavitation damage to a computer-modeled component.

BACKGROUND

Cavitation refers to the formation and activity of bubbles (or cavities) in a liquid. When describing cavitation, "formation" generally refers to the creation of a new cavity or an expansion of a preexisting one to a size where macroscopic effects are observable. Cavitation is classifiable into four different types based on the manner in which it is produced. Hydrodynamic cavitation is produced by pressure variations in a flowing liquid due to a geometry of a system. Acoustic cavitation is produced by sound (e.g., pressure) waves in a liquid due to pressure variations. Optic cavitation is produced by photons of high intensity (e.g., laser) light rupturing in a liquid. Particle cavitation is produced by any other type of elementary particles (e.g., a proton rupturing in a liquid, as in a bubble chamber). Hydrodynamic and acoustic cavitation occur due to tension in the liquid. Optic and particle cavitation result from a local deposition of energy. As the term is used herein, "cavitation" may refer to any of the above types.

When cavities encounter regions of pressure that are higher than the vapor pressure, the cavities collapse violently and emit pressure pulses. The pressure pulses may cause erosion of any solid in their vicinity. Such damage due to cavitation is common in hydraulic machinery, pumps, and fuel injectors, for example. In a flowing liquid, the location of the damage is not where the cavitation is generated, but instead is located at a collapse region that is downstream of the generation point. In a vibrating liquid, the area of damage may or may not be located where the cavitation is generated depending on whether or not a flow is superimposed on the vibrations as in, for example, a hydraulic pump. If the pressure pulses that act on a surface of a device component are of a sufficient magnitude and occur with frequency, removal of material from the surface can occur. Such damage may cause an eventual failure of the device.

U.S. Patent Application Publication No. 2004/0112115 A1 (the '115 publication) to Ramamoorthy et al. discloses a method and system for analyzing cavitation. According to the '115 publication, cavitation damage is predicted by comparing current liquid conditions in an existing real-world component with previous liquid conditions in which cavitation occurred. However, the method and system of the '115 publication do not simulate cavitation damage to a modeled component. Instead, a real-world component must be created and monitored in order to analyze possible cavitation damage to that component. Furthermore, the method and system of the '115 publication does not disclose simulating, using a computer-modeled component, whether voids or bubble collapses have a potential to cause damage to the computer-modeled component.

The disclosed embodiments are directed to overcoming one or more of the problems set forth above.

SUMMARY OF THE INVENTION

In one aspect, the present disclosure is directed to a computer-implemented method for simulating a potential for cavitation damage. The method may include importing data defining a modeled component to a flow solver tool and simulating, by the flow solver tool, a liquid that flows through the modeled component. Voids created by the flow of the liquid may cause a plurality of vapor implosion pressure events. The method may further include displaying a histogram showing a portion of the modeled component. Locations of the plurality of vapor implosion pressure events may be visually distinguishable on a surface of the portion of the modeled component.

In another aspect, the present disclosure is directed to a system for simulating a potential for cavitation damage. The system may include a flow solver tool. The flow solver tool may be operable to import data defining a modeled component to a flow solver tool and simulate a liquid that flows through the modeled component. Voids created by the flow of the liquid cause a plurality of vapor implosion pressure events. The flow solver tool may further display a histogram showing a portion of the modeled component. Locations of the plurality of vapor implosion pressure events may be visually distinguishable on a surface of the portion of the modeled component.

In yet another aspect, the present disclosure is directed to a computer-implemented method for predicting a potential for cavitation damage. The method may include importing data defining a modeled component to a flow solver tool and simulating, by the flow solver tool, a liquid that flows through the modeled component. Further, the method may include calculating frequencies for a plurality of vapor implosion events that occur in the modeled component and calculating magnitudes for the plurality of vapor implosion events. The frequencies and the magnitudes may be correlated to predict the potential for cavitation damage.

It is to be understood that both the foregoing general description and the following detailed description are exemplary and explanatory only and are not restrictive of the invention or embodiments thereof, as claimed.

BRIEF DESCRIPTION OF THE DRAWINGS

The accompanying drawings, which are incorporated in and constitute a part of this disclosure, illustrate various embodiments. In the drawings.

DETAILED DESCRIPTION

Reference will now be made in detail to exemplary embodiments, which are illustrated in the accompanying drawings. Wherever possible, the same reference numbers will be used throughout the drawings to refer to the same or like parts.

Figure 1:
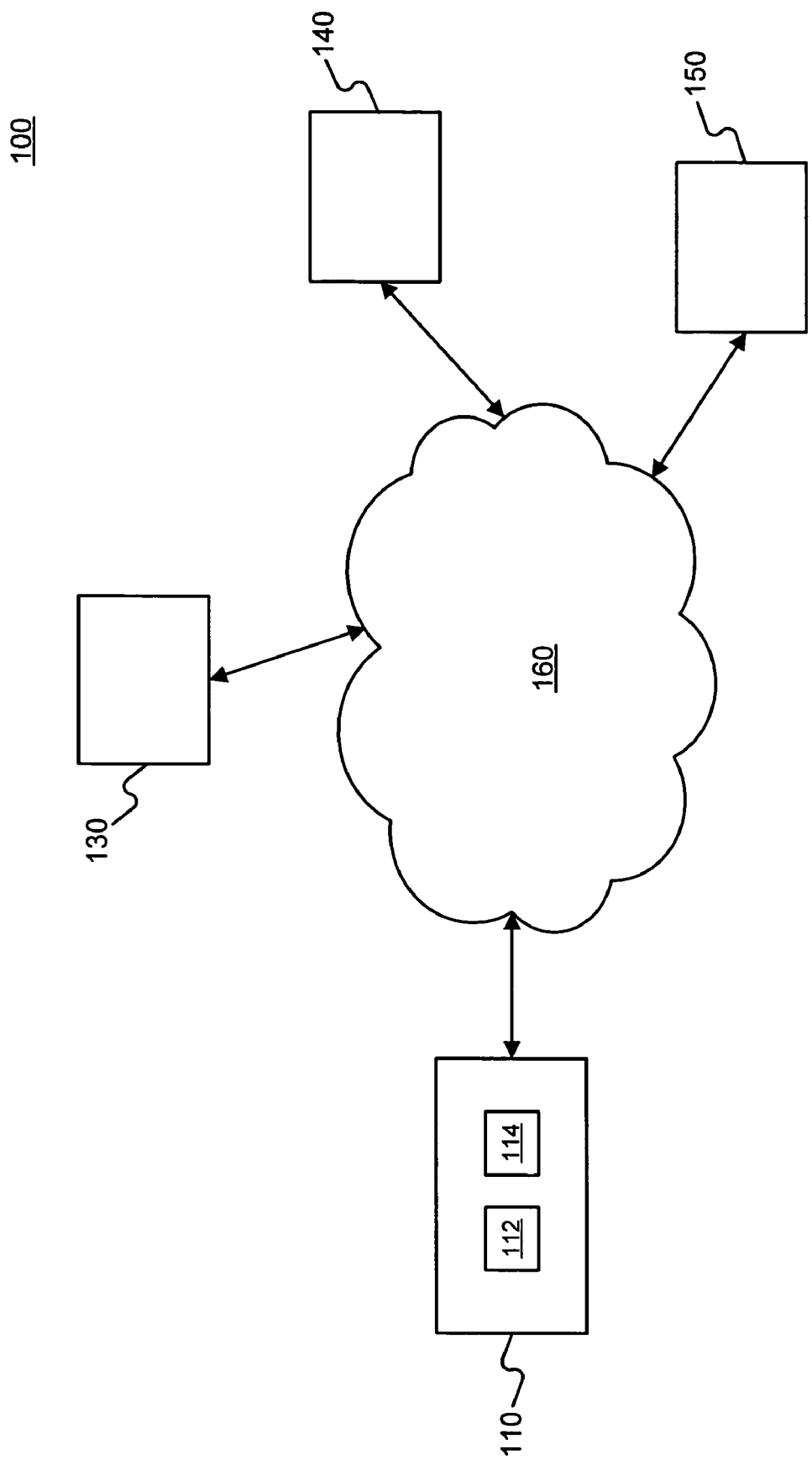
FIG. 1 is an exemplary system for simulating a potential for cavitation damage, consistent with a disclosed embodiment.

FIG. 1 is an exemplary system 100 for simulating a potential for cavitation damage, consistent with a disclosed embodiment. In particular, system 100 may simulate a potential for cavitation damage to a computer-modeled component, which may be modeled three-dimensionally. As shown in system 100, server 110, and terminals 130, 140, and 150 are connected to a network 160. One of skill in the art will appreciate that although three terminals are depicted in FIG. 1, any number of terminals may be provided. Furthermore, one of ordinary skill in the art will recognize that functions provided by one or more components of system 100 may be combined.

Network 160 provides communications between the various entities in system 100, such as server 110 and terminals 130-150. In addition, server 110 and terminals 130-150 may access legacy systems (not shown) via network 160, or may directly access legacy systems, databases, or other network applications, such as modeling tools. Network 160 may be a shared, public, or private network, may encompass a wide area or local area, and may be implemented through any suitable combination of wired and/or wireless communication networks. Furthermore, network 160 may comprise a local area network (LAN), a wide area network (WAN), an intranet, or the Internet.

Server 110 may comprise a general purpose computer (e.g., a personal computer, network computer, server, or mainframe computer) having a processor 112 that may be selectively activated or reconfigured by a computer program. Server 110 may also be implemented in a distributed network. For example, server 110 may communicate via network 160 with one or more additional servers (not shown), which may enable server 110 to distribute a process for parallel execution by a plurality of servers. Alternatively, server 110 may be specially constructed for carrying-out methods consistent with the disclosed embodiment. Furthermore, server 110 may include a memory 114 for storing program modules that, when executed by processor 112, perform one or more simulations. Memory 114 may be one or more memory devices that store data as well as software. Memory 114 may also comprise on or more of RAM, ROM, magnetic storage, or optical storage, for example.

Terminals 130-150 may be any type device for communicating with server 110 over network 160. For example, terminals 130-150 may be personal computers, handheld devices, or any other appropriate computing platform or device capable of exchanging data with network 160. Terminals 130-150 may each include a processor and a memory (not shown), for example. Further, terminals 130-150 may execute program modules that provide one or more graphical user interfaces (GUIs) for interacting with network resources. Users may access data through a web browser or software application running on any one of terminals 130-150. For example, a web portal may include options for allowing a user to log onto a secure site provided by server 110 by supplying credentials, such as a username and a password. Once logged onto the site, the web portal may display a series of screens prompting the user to make various selections to execute a flow solver tool, discussed below in further detail. In such an implementation, the flow solver tool may be stored as one or more program modules in memory 114 of server 110. Further, since some disclosed embodiments may be implemented using an HTTPS (hypertext transfer protocol secure) environment, data transfer over a network, such as the Internet, may be done in a secure fashion.

In an alternative implementation, instead of using server 110 to execute the program that provides the flow solver tool, any one of terminals 130-150 may execute the program. For example, the program that provides the flow solver tool may be stored in a memory (not shown) of one or more of terminals 130-150.

In operation, the flow solver tool may provide a user with the ability to import data defining a component. The component may be a part of hydraulic machinery, a pump, or a fuel injector, for example. Further, the component may be modeled three-dimensionally in virtual space using a software tool. Once data defusing the modeled component is imported to the flow solver tool, the flow solver tool may provide functionally that allows the user to input parameters governing a simulation, such as a time period for the simulation, liquid and vapor properties, and boundary conditions, for example. Alternatively, parameters governing the simulation may be received by the flow solver tool over network 160, for example. Once the simulation has been setup by a user and/or the setup parameters received via network 160, the flow solver tool may execute the simulation. The flow solver tool may simulate a flow of a liquid through the modeled component and the creation of voids in the liquid. Such voids may cause simulated pressure events. The flow solver tool may analyze the severity and location of the simulated pressure events in order to provide an analysis of the potential for cavitation damage to a surface of the modeled component. For example, the simulation may output an implosion histogram that visually displays results of the simulation.

As the term is used herein, an "implosion histogram" is a graphical representation of a distribution of a number of events that a particular range of a pressure occurred. The implosion histogram may display locations of the pressure events on a portion of the modeled component. For example, a scale may indicate number of pressure events within the particular range. Implosion histograms are discussed below in further detail with reference to FIGS. 2 and 3, which are discussed below in further detail.

Figure 2:
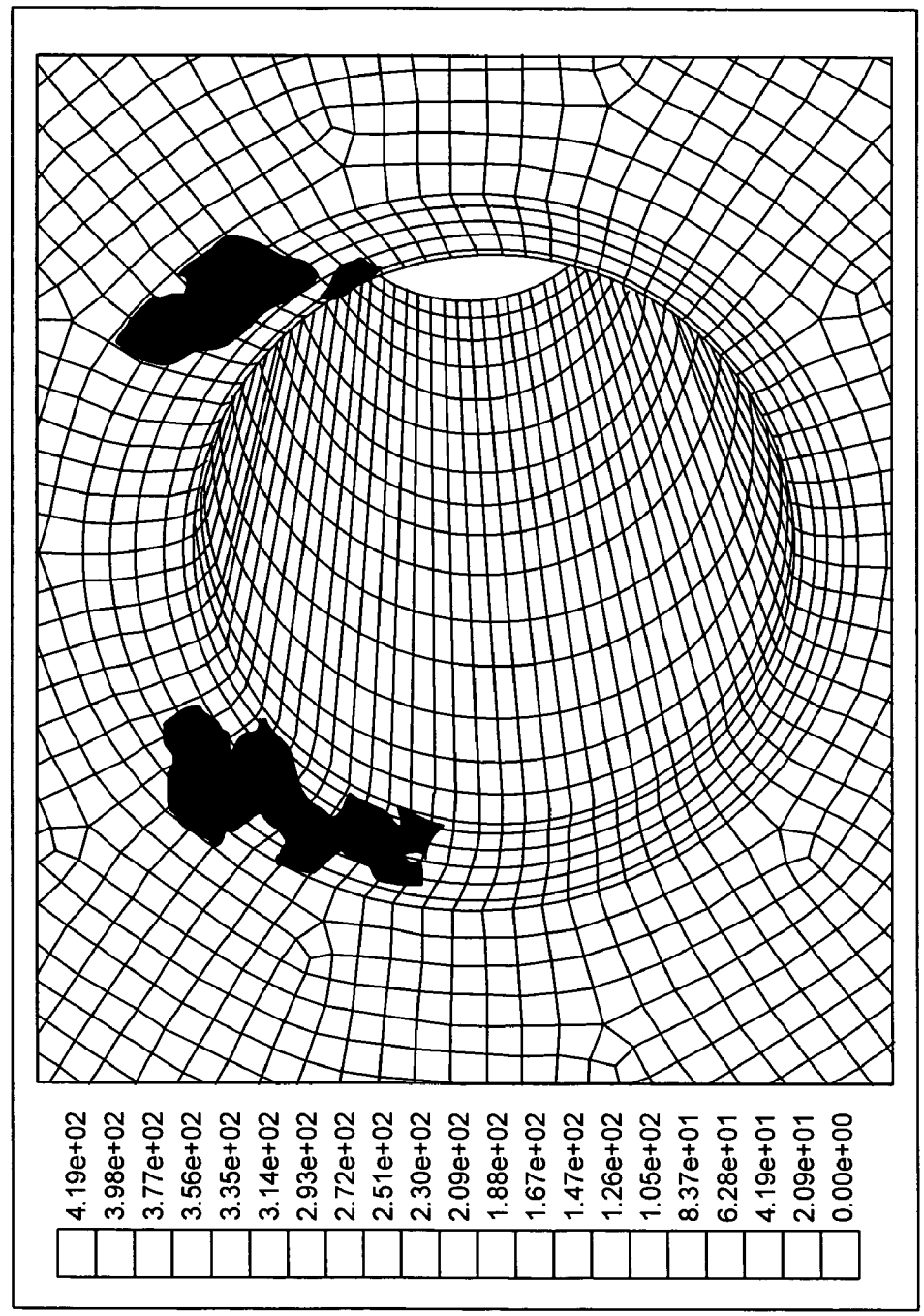
FIG. 2 is an implosion histogram showing exemplary results of a simulation from a first perspective, consistent with a disclosed embodiment.

FIG. 2 is an implosion histogram 200 showing exemplary results of a simulation from a first perspective, consistent with a disclosed embodiment. As discussed below in further detail, during setup of a simulation, a user may select a perspective of a computer-modeled component, such as a view from a particular angle. In addition, a user may select a pressure range and a time period for the simulation. For example, a user may select a low and high value in order to determine the range displayed on implosion histogram 200. During the simulation, quantities of pressure events that occur during the time period are recorded for display on an implosion histogram, such as implosion histogram 200.

Implosion histogram 200 provides contours of a computer-modeled component and displays impacts that have occurred during a simulation for a pressure range of, for example, 1,300-1,400 MPa. As shown in FIG. 2, several areas of damage with high pressures are shown on the modeled component. In particular, implosion histogram 200 may display locations of the pressure events on a portion of the modeled component. The displayed portion may provide an interior view of the component, such as a cross section view, for example.

As shown in FIG. 2, implosion histogram 200 includes a scale. The scale may indicate the number of pressure events that have occurred during the simulation within a selected pressure range. In FIG. 2, the scale ranges from a highest number of events, 4.19e+02 (i.e., 419 events), as indicated at the top of the scale, to a lowest number of events (i.e., zero). The scale may be color coded to indicate magnitude. For example, red may indicate a highest number of events within the pressure range and blue may indicate a lowest number of events within the pressure range. Alternatively, pressure events may be shaded or hatched to indicate a corresponding quantity of pressure events. For example, darker areas of the image may indicate a greatest number of events and lightest areas of the image may indicate a least number of events. Accordingly, areas of the three-dimensional model that have experienced a corresponding number of pressure events are visually distinguishable on implosion histogram 200.

Figure 3:
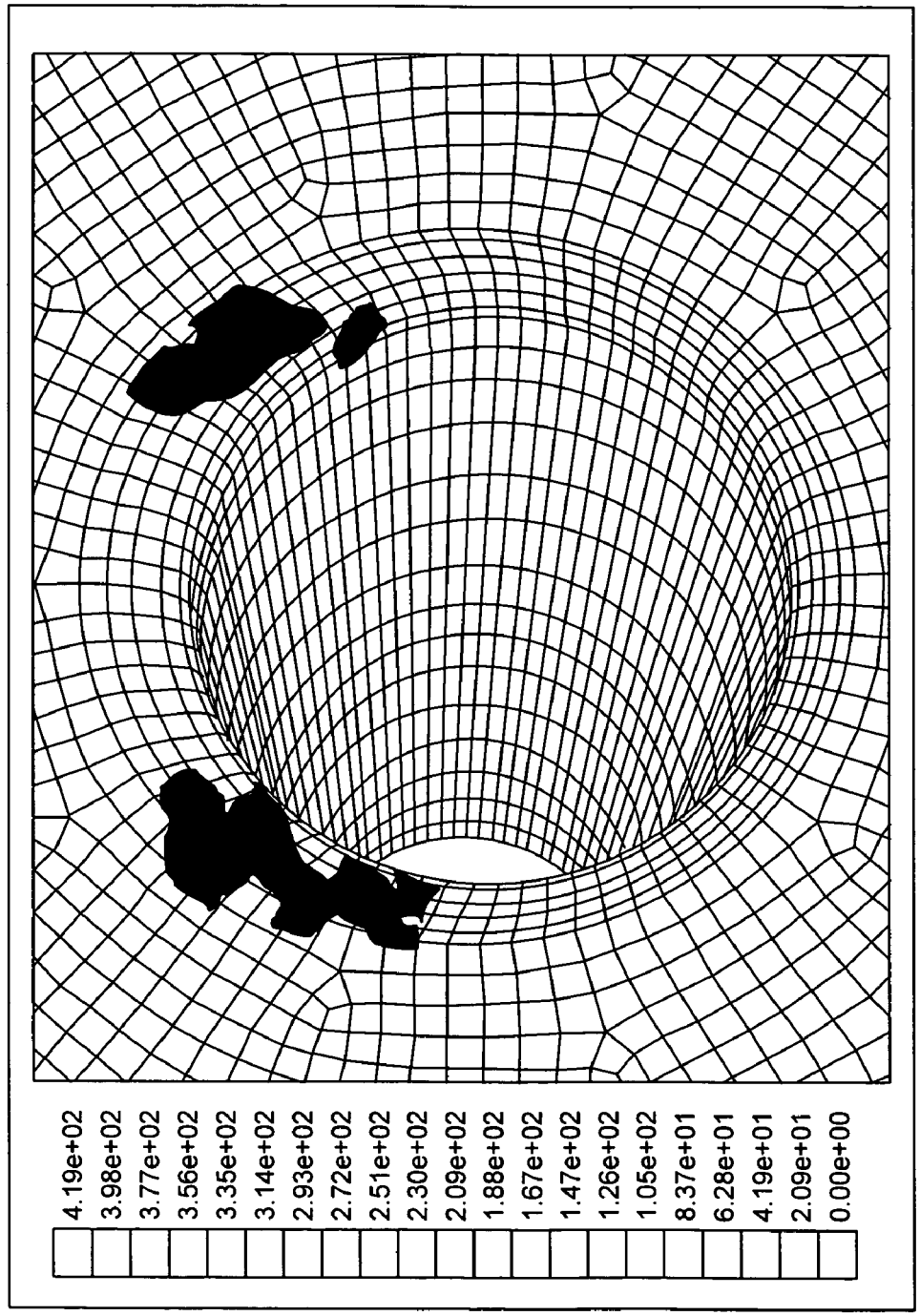
FIG. 3 is an implosion histogram showing exemplary results of the simulation from a second perspective, consistent with a disclosed embodiment.

FIG. 3 is an implosion histogram 300 showing exemplary results of the simulation from a second perspective, consistent with a disclosed embodiment. As shown in FIG. 3, a different perspective is shown of the same component shown in FIG. 2. Further, implosion histogram 300 displays contours of the computer-modeled component and displays impacts that have occurred during the simulation for the same pressure range shown in FIG. 2 (i.e., 1,300-1,400 MPa). FIG. 3 also includes the same scale as FIG. 2. Accordingly, a user may examine a modeled component from one or more perspectives in order to view potential areas where cavitation damage will occur. As discussed above, implosion histogram 300 may visually indicate areas that experienced certain quantities of pressure events through the use of color, shading, or hatching, for example.

Consistent with disclosed embodiments, the flow solver tool may generate a sequence of implosion histograms for different pressure range and/or different perspectives. For example, a user may specify that the flow solver tool should generate an implosion histogram for 0-1,000 MPa, another implosion histogram for 1,000-1,500 MPa, and yet another for 1,500-2,000 MPa, for example. Accordingly, while FIGS. 2 and 3 show implosion histograms 200 and 300 having a pressure range of 1,300-1,400 MPa, one of ordinary skill in the art will appreciate that any range may be specified. Further, the user may specify that each implosion histogram should be generated for one or more user-defined perspectives. Still further, a user may display a side-by-side comparison of an exemplary implosion histogram for an original design and an exemplary implosion histogram for a modified design in order to compare and contrast the two designs.

Figure 4:
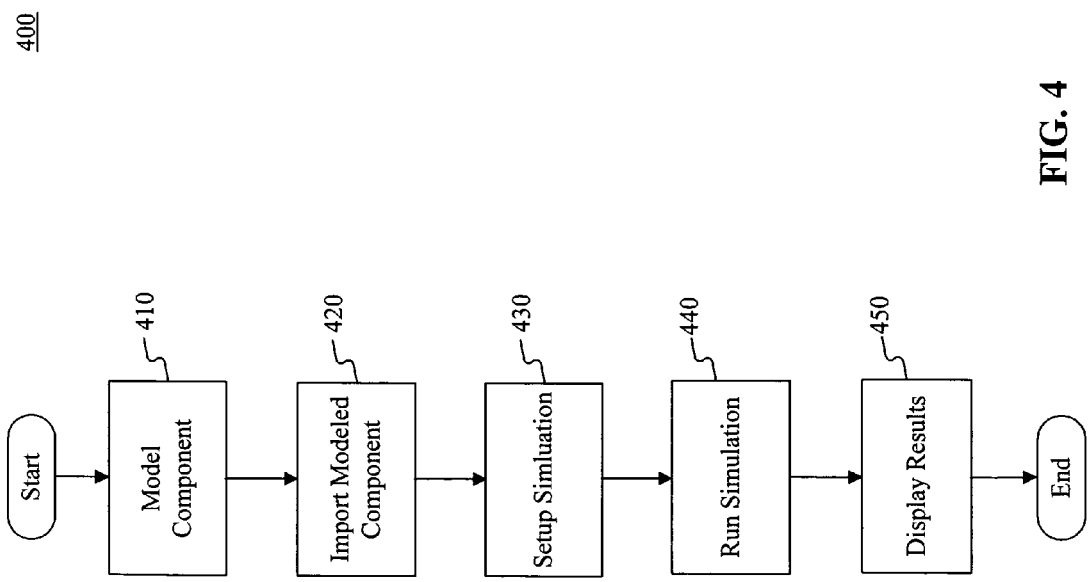
FIG. 4 is an exemplary flow diagram of a method for simulating a potential for cavitation damage, consistent with a disclosed embodiment.

FIG. 4 is an exemplary flow diagram of a method 400 for simulating a potential for cavitation damage, consistent with a disclosed embodiment. Disclosed embodiments calculate an intensity of a pressure pulse and a number of voids or bubbles that collapse at or near a surface of a material in order to simulate a potential for cavitation damage to the material. The material may be incorporated as part of a component used in a device, such as hydraulic machinery, pumps, and fuel injectors, for example. Further, method 400 includes steps related to a simulation of cavitation damage to a modeled component. Accordingly, after running a simulation according to method 400, one may understand whether a design of a component will incur cavitation damage before building a real-world embodiment of the design.

In step 410, a component or a portion of a component is modeled. The component may be modeled using an appropriate modeling tool. Data describing a component's geometry may have been determined by a designer. That data be used as a basis for generating the three-dimensional model. For example, in this step, the component may be modeled using a tool that builds a "mesh," or wireframe model, in three-dimensional virtual space. The design may be saved in an appropriate file format that is compatible with the flow solver tool. For example, a user at one of terminals 130-150 may import the file. The process proceeds to step 420.

Next, in step 420, the file describing the geometry of the modeled component is imported into the flow solver tool, which may be executed by, for example, server 110 or one or more of terminals 130-150. The flow solver tool may provide a user interface and include software functionality for importing one or more files that describe the geometry of a component. For example, a user may indicate a storage location of the one or more files. The process continues to step 430.

In step 430, parameters for the simulation may be setup. For example, a user may set parameters or the flow solver tool may receive a set of parameters over network 160, for example. The parameters may include a time period of the simulation, a type of liquid for the simulation, liquid and vapor properties, and any boundary conditions. For example, during step 430, a user may specify boundary conditions that govern a flow of the liquid and/or pressure ranges for results that will be displayed on an implosion histogram. Further, a user may specify a pressure range, such as those discussed above with reference to FIGS. 2 and 3. For example, the user may indicate that after the simulation concludes, the flow solver tool should generate an implosion histogram displaying impacts that occurred for a pressure range of 500-1,000 MPa, for example. Once all setup parameters have been selected and/or received, the process proceeds to step 440.

In step 440, the flow solver tool executes the simulation. For example, the flow solver tool may simulate a liquid that flows through the modeled component. During the simulation, voids created by the flow of the liquid may cause pressure events. In particular, the simulation may divide a surface of the modeled component that is exposed to the liquid into a plurality of cells. Each cell may correspond to a unit of the material's surface and the simulation may calculate quantities for the modeled component on a per cell basis. That is, the flow solver tool may determine a number of pressure events per cell as well as a severity of each of the pressure events. More details concerning step 440 are discussed below in connection with FIG. 5. After the simulation has completed, the process continues to step 450.

In step 450, the flow solver tool displays one or more results of the simulation. For example, after the simulation concludes, the flow solver tool may generate an implosion histogram showing a portion of the modeled component. The implosion histogram may be displayed on a display device (not shown) included or in communication with one of terminals 130-150 and/or server 110.

Figure 5:
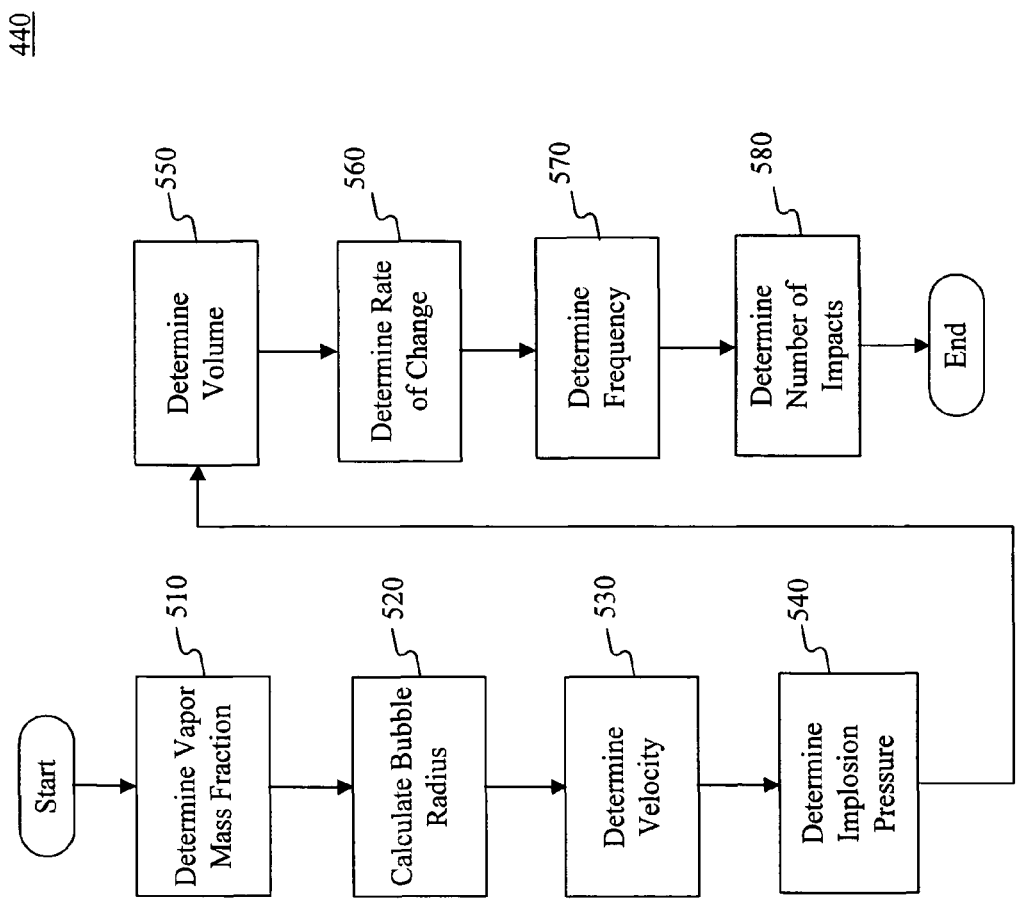
FIG. 5 is an exemplary flow diagram of a method for calculating cavitation damage, consistent with step 440 of FIG. 4.

FIG. 5 is an exemplary flow diagram of a method for calculating cavitation damage, consistent with step 440 of FIG. 4. FIG. 5 provides further details of the process performed by step 440. As discussed above, a simulation may divide a surface of the modeled component that is exposed to the liquid into a plurality of cells. Each cell may correspond to a unit of the material's surface and the simulation may calculate quantities for the modeled component on a per cell basis.

In step 510, during the simulation, at the start of an implosion pressure calculation, the flow solver tool determines a vapor mass fraction, $\alpha$. The vapor mass fraction represents an estimate of the amount of vapor per cell, based on a number of voids or bubble nuclei per unit volume ($n_o$) or cell. The flow solver tool may arrive at a value for the vapor mass fraction based on a variable set by a user in setup step 430 or based on a predetermined value. The process proceeds to step 520.

Next, in step 520, the flow solver tool calculates a bubble radius, R, using $\alpha$ in equation (1).

$$R = \sqrt[3]{\frac{3}{4} \frac{\alpha}{n_o \pi}} \qquad (1)$$

According to equation (1), $n_o$ provides a number of voids or bubble nuclei per unit volume (e.g., for each cell). For example, $n_o$ can be set to $10^{14}$ nuclei/m$^3$, which is an average value representing a typical industrial liquid. As shown in equation (1), a radius R is found for each cell. The process proceeds to step 530.

In step 530, the flow solver tool takes a derivative of the radius R to determine a velocity ($v_l$) of a collapse of each bubble wall, as given in equation (2).

$$v_l = \frac{dR}{dt} = \frac{\partial R}{\partial t} + \vec{V} \cdot \nabla R \qquad (2)$$

Next, in step 540, the flow solver tool determines a bubble implosion pressure for a cell. Equation (3) provides a generalized water hammer equation in which a bubble implosion pressure for a cell, $p_b$, is calculated using Newton's method. In equation (3), $\rho_o$ and $p_o$ are the ambient density and pressure, respectively, B is a liquid bulk modulus, and n is a constant.

$$v_l = \sqrt{\frac{p_b - p_o}{\rho_o}\left[1 - \left(\frac{p_b + B}{p_o + B}\right)^{-\frac{1}{n}}\right]} \qquad (3)$$

Next, in step 550, in order to determine a frequency of void or bubble collapse, the flow solver tool determines a volume of the bubble, $V_b$, as given in equation (4).

$$V_b = \frac{4}{3}\pi R^3 \qquad (4)$$

Next, in step 560, the flow solver tool calculates a rate of change of the collapsing bubble with respect to time, as shown in equation (5).

$$\frac{dV_b}{dt} = 4\pi R^2 \frac{dR}{dt} \qquad (5)$$

Next, in step 570, the flow solver tool calculates a frequency (f) of the bubble collapse, as given in equation (6).

$$f = \frac{1}{V_b}\frac{dV_b}{dt} = \frac{3}{R}\frac{dR}{dt} \qquad (6)$$

Next, in step 580, the flow solver tool integrates equation (6) with respect to time to give the number of impacts over the transient simulation interval. The process may then end. However, the above steps may be repeated for each cell representing a unit surface of a modeled component.

After the process ends, as discussed above in connection with step 450, a number of events for a particular pressure range may be displayed on an implosion histogram, as shown in FIGS. 2 and 3. Further, side by side comparisons of implosion histograms may allow a designer to determine which design will result in a least amount of cavitation damage. For example, the flow solver tool may display an implosion histogram for an initial design next to an implosion histogram for a modified design. A user may specify a pressure range for the implosion histogram and/or a perspective.

Consistent with disclosed embodiments, the flow solver tool may calculate other quantities during a simulation. Any of the follow quantities may be calculated, at a user's discretion, during step 440 in addition to the quantities discussed in connection with FIG. 5. For example, a user, during setup of a simulation, may specify that one or more additional quantities should be displayed upon completion of the simulation. These quantities may be displayed along with one or more implosion histograms.

For example, a "bubble volume creation rate" is determined from equation (7), shown below. The "bubble volume creation rate" refers to a rate at which bubbles are created per unit volume. The later is positive for locations where bubbles are created and negative at locations where bubbles are destroyed. The "bubble volume creation rate" is found by integrating equation (7) with respect to time, as given below.

$$\frac{d\alpha}{dt} = \frac{\partial \alpha}{\partial t} + \vec{V} \cdot \nabla \alpha \qquad (7)$$

As shown below, equation (8) provides a pressure wave power equation. In particular, equation (8) represents a magnitude of the power released by collapsing bubbles during a simulation.

$$P = (p - p_v)\frac{d\alpha}{dt}, \qquad (8)$$

where P represents the power, p is the liquid pressure, and $p_v$ is the liquid vapor pressure.

Equation (8) may be integrated with respect to time to determine a "pressure wave energy" quantity, which indicates how much energy is deposited at a cell location over the course of a transient simulation.

In addition, the flow solver may display a "maximum vapor implosion pressure" by determining a highest pressure that occurred during a simulation, i.e., a highest $p_b$ value.

The flow solver may calculate a "maximum endurance limit ratio" quantity, which indicates whether or not damage is expected due to cavitation. The quantity is an approximation that is based on the Thiruvengadam equation. The Thiruvengadam equation provides that damage will occur only if the bubble implosion pressure is more than half of the endurance limit of the solid material, and is shown in equation (9).

$$\frac{\rho_l c_l v_l}{\sigma_e} > \frac{1}{2}, \qquad (9)$$

where $\sigma_e$ represents the endurance limit of the material.

Any one or more of the above quantities may be displayed in addition to, or instead of, the implosion histograms discussed above at the conclusion of a simulation by the flow solver tool.

INDUSTRIAL APPLICABILITY

Disclosed embodiments provide a flow solver tool that simulates a potential for cavitation damage to a material. The flow solver tool may provide functionally that allows a user to input parameters governing a simulation, such as a time period for the simulation, liquid and vapor properties, and boundary conditions, for example. Once the simulation has been setup, the flow solver tool may execute the simulation.

During the simulation, the flow solver tool may simulate a flow of a liquid through a modeled component and the creation of voids in the liquid. Such voids may cause simulated pressure events. The flow solver tool may analyze the severity and location of the simulated pressure events in order to provide an analysis of the potential for cavitation damage to a surface of the modeled component. For example, the simulation may output an implosion histogram that visually provides results of the simulation. Based on the simulation results, a designer may revise the design of the component to reduce cavitation damage. Further, the designer may execute a simulation of the revised design in order to determine whether the revised design results in less cavitation damage. Accordingly, a designer may use the tool to predict damage and adjust a design to minimize damage.

The foregoing description has been presented for purposes of illustration. It is not exhaustive and does not limit the invention to the precise forms or embodiments disclosed. Modifications and adaptations of the invention will be apparent to those skilled in the art from consideration of the specification and practice of the disclosed embodiments. For example, the described implementations include software, but systems and methods consistent with the present invention may be implemented as a combination of hardware and software or in hardware alone. Examples of hardware include computing or processing systems, including personal computers, servers, laptops, mainframes, microprocessors and the like. Additionally, although aspects of the invention are described for being stored in memory, one skilled in the art will appreciate that these aspects can also be stored on other types of computer-readable media, such as secondary storage devices, for example, hard disks, floppy disks, or CD-ROM, the Internet or other propagation medium, or other forms of RAM or ROM.

Computer programs based on the written description and methods of this invention are within the skill of an experienced developer. The various programs or program modules can be created using any of the techniques known to one skilled in the art or can be designed in connection with existing software. For example, program sections or program modules can be designed in or by means of Java, C++, HTML, XML, or HTML with included Java applets. One or more of such software sections or modules can be integrated into a computer system or browser software.

Moreover, while illustrative embodiments of the invention have been described herein, the scope of the invention includes any and all embodiments having equivalent elements, modifications, omissions, combinations (e.g., of aspects across various embodiments), adaptations and/or alterations as would be appreciated by those in the art based on the present disclosure. Further, the steps of the disclosed methods may be modified in any manner, including by reordering steps and/or inserting or deleting steps, without departing from the principles of the invention. It is intended, therefore, that the specification and examples be considered as exemplary only, with a true scope and spirit of the invention being indicated by the following claims and their full scope of equivalents.

What is claimed is:

1. A computer-implemented method for designing and constructing a component from an initial design of a modeled component, wherein the component is designed and constructed to minimize cavitation damage caused by a liquid flowing therethrough, the method comprising:
   importing data defining the initial design into a flow solver tool stored in a memory of a computer;
   simulating, by the flow solver tool, a flow of the liquid through the initial design, wherein voids created by the flow of the liquid cause a plurality of vapor implosion pressure events;
   displaying a histogram showing a portion of the initial design, wherein damage caused by the plurality of vapor implosion pressure events are visually distinguishable on a surface of the portion of the initial design;
   adjusting the initial design at the surface to minimize the damage to provide an adjusted design; and
   constructing the component from the adjusted design.

2. The method of claim 1, wherein the damage caused by the plurality of vapor implosion pressure events are shaded according to a severity of each of the plurality of vapor implosion pressure events.

3. The method of claim 2, wherein the severity is indicated according to a color scale in which red indicates a highest vapor implosion pressure and blue indicates a lowest vapor implosion pressure.

4. The method of claim 1, wherein the histogram includes a key that indicates how many of the plurality of vapor implosion pressure events correspond to one or more vapor implosion pressure values.

5. The method of claim 1, wherein the simulation includes steps of:
   calculating a vapor mass fraction for a cell of the initial design;
   calculating a velocity of a collapse of a void in the liquid using the vapor mass fraction;
   calculating a vapor implosion pressure for the cell using a bubble wall collapse velocity;
   calculating a frequency that the cell experiences the vapor implosion pressure; and
   calculating a number of events of the vapor implosion pressure for the cell over a period of time.

6. The method of claim 5, wherein the cell represents a portion of the surface of the initial design.

7. The method of claim 1, further comprising:
   calculating a vapor volume created for a cell over a period of time.

8. The method of claim 1, further comprising:
   calculating a pressure wave energy for a cell over a period of time.

9. The method of claim 1, further comprising:
   calculating a maximum vapor implosion pressure for a cell over a period of time.

10. The method of claim 1, further comprising:
    calculating a maximum endurance limit ratio for a cell over a period of time.

11. A system for simulating a potential for cavitation damage of an initial design of a modeled component and for storing data for adjusting the initial design, the system comprising:
    a server with a memory storing executable instructions which when executed on the server perform a method comprising:
    executing a flow solver tool, and importing data into the flow solver tool defining the initial design;
    simulating, by the flow solver tool, a flow of a liquid through the initial design, wherein voids created by the flow of the liquid cause a plurality of vapor implosion pressure events; and
    displaying a histogram showing a portion of the initial design, wherein damage caused by the plurality of vapor implosion pressure events are visually distinguishable on a surface of the portion of the initial design; and storing the histogram in the memory for later use in adjusting the initial design and creating an adjusted design.

12. The system of claim 11, wherein the damage caused by the plurality of vapor implosion pressure events are shaded according to a severity of each of the plurality of vapor implosion pressure events.

13. The system of claim 12, wherein the severity is indicated according to a color scale in which red indicates a highest vapor implosion pressure and blue indicates a lowest vapor implosion pressure.

14. The system of claim 11, wherein the histogram includes a key that indicates how many of the plurality of vapor implosion pressure events correspond to one or more vapor implosion pressure values.

15. The system of claim 11, wherein the execution of the flow solver tool, during the simulation further comprises:
    calculating a vapor mass fraction for a cell of the initial design;
    calculating a velocity of a collapse of a void in the liquid using the vapor mass fraction;
    calculating a vapor implosion pressure for the cell using a bubble wall collapse velocity;
    calculating a frequency that the cell experiences the vapor implosion pressure; and
    calculating a number of events of the vapor implosion pressure for the cell over a period of time.

16. The system of claim 15, wherein the cell represents a portion of the surface of the initial design.

17. A computer-readable medium consisting of hard disks, floppy disks, CD-ROMs, RAM, ROM and combinations thereof storing executable instructions which when executed by a processor perform a method of simulating a potential for cavitation damage of an initial design of a modeled component, the method comprising:
    importing data defining the initial design of the modeled component to a flow solver tool;
    simulating, by the flow solver tool, a flow of a liquid through the initial design, wherein voids created by the flow of the liquid cause a plurality of vapor implosion pressure events;
    displaying a histogram showing a portion of the initial design, wherein damage caused by the plurality of vapor implosion pressure events are visually distinguishable on a surface of the portion of the initial design; and
    storing the histogram in the computer-readable medium for later use in adjusting the data defining the initial design of the modeled component.

18. The computer-readable medium of claim 17, wherein the damage caused by the plurality of vapor implosion pressure events are shaded according to a severity of each of the plurality of vapor implosion pressure events.

19. The computer-readable medium of claim 17, wherein the histogram includes a key that indicates how many of the plurality of vapor implosion pressure events correspond to one or more vapor implosion pressure values.

20. The computer-readable medium of claim 17, wherein the simulation includes steps of:
    calculating a vapor mass fraction for a cell of the initial design;
    calculating a velocity of a collapse of a void in the liquid using the vapor mass fraction;
    calculating a vapor implosion pressure for the cell using a bubble wall collapse velocity;
    calculating a frequency that the cell experiences the vapor implosion pressure; and
    calculating a number of events of the vapor implosion pressure for the cell over a period of time.

* * * * *